(12) United States Patent (10) Patent No.: US 9,324,937 B1
Annunziata et al. (45) Date of Patent: Apr. 26, 2016

(54) THERMALLY ASSISTED MRAM INCLUDING MAGNETIC TUNNEL JUNCTION AND VACUUM CAVITY

(71) Applicants: International Business Machines Corporation, Armonk, NY (US); Crocus Technology Inc., Santa Clara, CA (US)

(72) Inventors: Anthony J. Annunziata, Stamford, CT (US); Erwan Gapihan, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/666,363

(22) Filed: Mar. 24, 2015

(51) Int. Cl.
*H01L 43/02* (2006.01)
*H01L 43/08* (2006.01)
*H01L 43/12* (2006.01)
*H01L 43/10* (2006.01)

(52) U.S. Cl.
CPC ............... *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12
See application file for complete search history.

(56) References Cited

U.S. PATENT DOCUMENTS

| | | | |
|---|---|---|---|
| 5,286,976 A | 2/1994 | Cole | |
| 5,510,645 A | 4/1996 | Fitch et al. | |
| 5,933,365 A | 8/1999 | Klersy et al. | |
| 6,023,091 A | 2/2000 | Koch et al. | |
| 6,911,685 B2 | 6/2005 | Anthony et al. | |
| 7,507,986 B2 | 3/2009 | Lung | |
| 7,714,315 B2 | 5/2010 | Happ et al. | |
| 7,855,435 B2 | 12/2010 | Klostermann et al. | |
| 7,928,421 B2 | 4/2011 | Lung | |
| 8,076,663 B2 | 12/2011 | Liu | |
| 8,492,224 B2 | 7/2013 | Purayath et al. | |
| 8,546,239 B2 | 10/2013 | Harari et al. | |
| 8,609,262 B2 * | 12/2013 | Horng ................. C23C 14/3414 257/295 |
| 8,767,448 B2 * | 7/2014 | Annunziata ............. H01L 43/12 365/148 |
| 2002/0081753 A1 | 6/2002 | Gates et al. | |
| 2003/0210586 A1 | 11/2003 | Nakajima et al. | |
| 2004/0169214 A1 | 9/2004 | Nakajima et al. | |
| 2005/0285093 A1 | 12/2005 | Yoshihara et al. | |
| 2006/0163196 A1 | 7/2006 | Amano et al. | |
| 2007/0052009 A1 | 3/2007 | Xie et al. | |

(Continued)

OTHER PUBLICATIONS

Deak et al., "Effect of Resistance-Area-Product and Thermal Environment on Writing of Magneto-Thermal MRAM," IEEE Transactions on Magnetics, vol. 42, Issue 10, Oct. 2006, pp. 2721-2723.

(Continued)

*Primary Examiner* — William Coleman
(74) *Attorney, Agent, or Firm* — Cantor Colburn LLP; Vazken Alexanian

(57) ABSTRACT

A thermally assisted magnetoresistive random access memory (TAS-MRAM) device includes a magnetic tunnel junction interposed between a first electrical contact and a second electrical contact. The TAS-MRAM device further includes a dielectric layer that is formed on an upper surface of the first electrical contact and that encapsulates the second electrical contact. The dialectic layer has at least one vacuum cavity between an adjacent outer wall of the magnetic tunnel junction and the dielectric layer.

19 Claims, 7 Drawing Sheets

(56) References Cited

U.S. PATENT DOCUMENTS

| | | |
|---|---|---|
| 2008/0209118 A1 | 8/2008 | Kajiyama |
| 2009/0122597 A1 | 5/2009 | Sugibayashi et al. |
| 2009/0174015 A1 | 7/2009 | Gu et al. |
| 2009/0218559 A1 | 9/2009 | Klostermann |
| 2011/0155987 A1 | 6/2011 | Mizuguchi et al. |
| 2012/0106245 A1 | 5/2012 | MacKay et al. |
| 2012/0231604 A1 | 9/2012 | Liu |
| 2014/0153128 A1* | 6/2014 | Teguri ............ G11B 5/65 360/59 |
| 2014/0246741 A1* | 9/2014 | Guo ............ H01L 43/08 257/421 |
| 2015/0001457 A1* | 1/2015 | Krebs ............ H01L 45/1293 257/4 |
| 2015/0061051 A1* | 3/2015 | Huang ............ H01L 43/12 257/421 |

OTHER PUBLICATIONS

International Preliminary Report on Patentability for corresponding PCT Application No. PCT/US13/50803, dated Jun. 2, 2015, pp. 1-5.
International Search Report for corresponding PCT Application No. PCT/US13/50803, dated Jan. 10, 2014, pp. 1-10.
Written Opinion for corresponding PCT Application No. PCT/US13/50803, dated Jan. 10, 2014, pp. 1-4.

* cited by examiner

THERMALLY ASSISTED MRAM INCLUDING MAGNETIC TUNNEL JUNCTION AND VACUUM CAVITY

BACKGROUND

The present invention relates to magnetic memory devices, and more specifically, to thermally-assisted magnetoresistive random access memory (TAS-MRAM) devices that provide lower thermal conductivity.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic layers, each of which can hold a magnetic field, separated by a thin insulating layer. One of the two layers is a reference magnet set to a particular polarity, while the remaining layer's field can be changed to match that of an external field to store memory and is termed the "free magnet" or "free-layer". This configuration is known as a magnetic tunnel junction (MTJ) and is the simplest structure for a MRAM bit. A memory device is built from a grid of such "cells." In some configurations of MRAM, such as the type further discussed herein, both the reference and free layers of the magnetic tunnel junctions can be switched using an external magnetic field.

A variation of MRAM technology includes a thermally-assisted magnetoresistive random access memory (TAS-MRAM). A TAS-MRAM device requires heating of the magnetic tunnel junction stack to a write temperature ($T_{write}$) higher than the operating temperature ($T_{op}$) in order to write the device. The increased write temperature is typically achieved by Joule heating using a bias current that is applied during the write process. The amount of power required to heat the device to $T_{write}$ depends strongly on the thermal conductivity between the device/surrounding structures and the substrate. Conventional TAS-MRAM devices are susceptible to large amounts of thermal leakage at the magnetic tunnel junction. Consequently, the power necessary to achieve $T_{write}$ for a device having a large number of devices and surrounding structures can be undesirably large to compensate for the thermal leakage.

SUMMARY

According to at least one embodiment of the present invention, a thermally assisted magnetoresistive random access memory (TAS-MRAM) device includes a magnetic tunnel junction interposed between a first electrical contact and a second electrical contact. The TAS-MRAM device further includes a dielectric layer that is formed on an upper surface of the first electrical contact and that encapsulates the second electrical contact. The dialectic layer has at least one vacuum cavity between an adjacent outer wall of the magnetic tunnel junction and the dielectric layer.

According to another embodiment, a method of fabricating a thermally assisted magnetoresistive random access memory (TAS-MRAM) device comprises forming a magnetic tunnel junction between a first electrical contact and a second electrical contact. The method further includes performing a deposition process to deposit a dielectric layer that encapsulates the second electrical contact. The method further includes at least one vacuum cavity that is formed between an adjacent outer wall of the magnetic tunnel junction and the dielectric layer while simultaneously depositing the dielectric layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings.

FIGS. 1-7 are a series of cross-sectional views illustrating a process flow of fabricating a TAS-MRAM device according to a non-limiting embodiment, in which:

FIG. 1 is a cross-sectional view of a starting substrate including a resistive contact layer formed on a first electrically conductive layer, a magnetic tunnel junction (MTJ) layer formed on an upper surface of the resistive contact layer, and a second electrically conductive layer formed on the MTJ layer;

FIG. 2 illustrates the substrate of FIG. 1 following deposition of a masking layer on an upper surface of the second contact layer;

FIG. 3 illustrates the substrate of FIG. 2 after patterning the masking layer to form a masking element on the upper surface of the second contact layer;

FIG. 4 illustrates the substrate of FIG. 3 following an etching process that recesses portions of the second contact layer and the MTJ layer to expose the resistive contact layer and to form a magnetic tunnel junction between the resistive contact layer and an electrically conductive contact;

FIG. 5 illustrates the substrate of FIG. 4 after removing the masking element from the contact;

FIG. 6 illustrates the substrate of FIG. 4 after depositing a bulk dielectric layer on the exposed surface of the resistive contact layer to cover the contact while forming vacuum cavities at sidewalls of the magnetic tunnel junction; and FIG. 7 illustrates the substrate of FIG. 5 after recessing an upper portion of the bulk dielectric layer to expose the upper surface of the contact and following deposition of an electrically conductive electrode on the contact to form a TAS-MRAM device.

DETAILED DESCRIPTION

Various embodiments of the invention provide a TAS-MRAM device including a magnetic tunnel junction on a resistive contact layer. The TAS-MRAM device further includes a dielectric layer formed on the resistive contact layer, which surrounds the magnetic tunnel junction and covers an electrically conductive contact disposed on the magnetic tunnel junction. One or more vacuum cavities are self-created when depositing the dielectric layer. The vacuum cavities are formed between sidewalls of the magnetic tunnel junction and the dielectric layer, and provide an extremely low thermal conductivity compared to solid dielectric materials disposed directly against the magnetic tunnel junction. In this manner, thermal leakage from the TAS-MRAM is reduced, thereby reducing the power required to heat the TAS-MRAM device 100 to $T_{write}$. Accordingly, the overall power efficiency of the TAS-MRAM device is increased.

Figure 1:
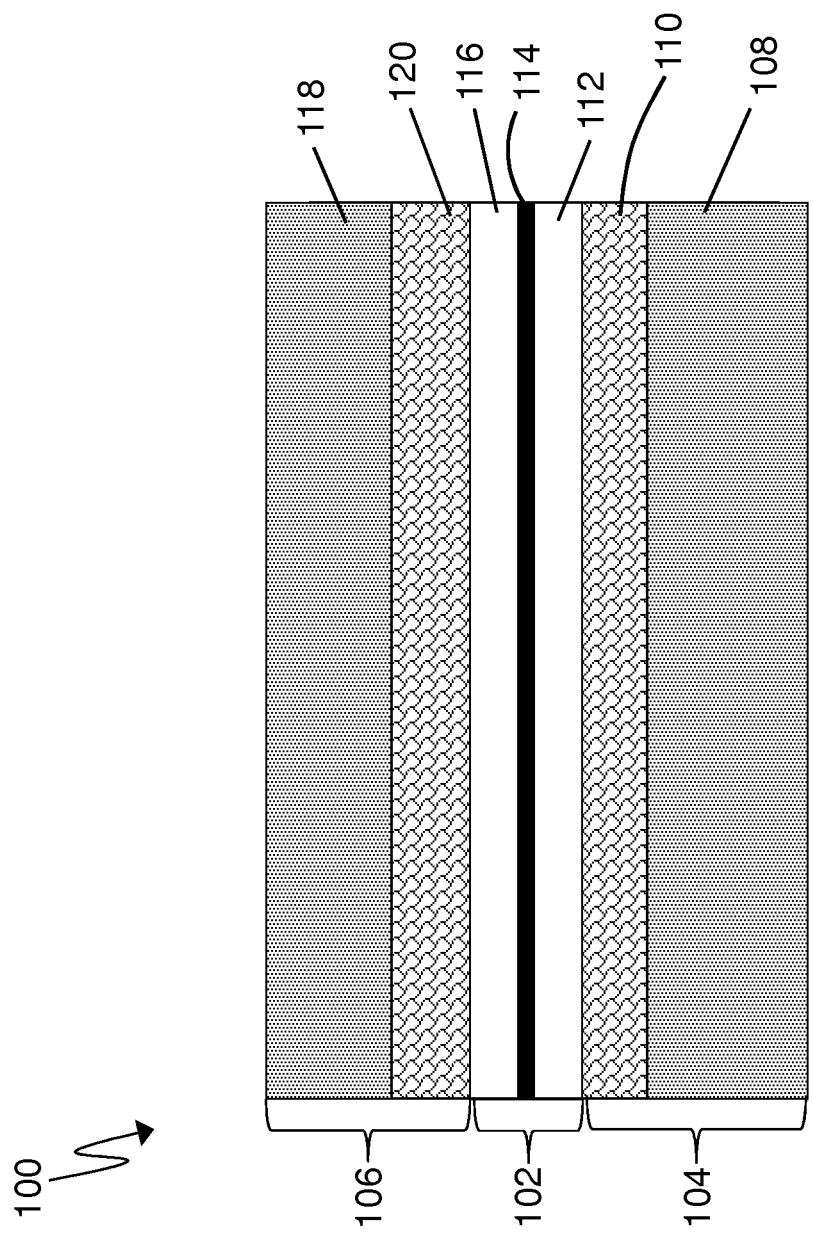

With reference now to FIG. 1, an intermediate substrate 100 that serves the basis for fabricating a completed TAS-MRAM device (not shown in FIG. 1) is illustrated according to a non-limiting embodiment of the invention. The substrate 100 includes a magnetic tunnel junction (MTJ) portion 102 interposed between a first substrate portion 104 (e.g., a lower substrate portion 104) and a second substrate portion 106 (e.g., an upper substrate portion 106).

The lower substrate portion 104 includes a first electrically conductive layer 108 and a first resistive contact layer 110 (i.e., a resistive strap 110) formed on an upper surface of the first electrically conductive layer 108. The first electrically conductive layer 108 comprises any suitable electrically conductive material including, but not limited to, metal, and can be utilized as an electrical contact. The resistive strap 110 comprises a thermally resistive material such as, for example, tantalum nitride (TaN), tantalum-silicon nitride (TaSiN), cobalt-silicon nitride (CoSiN), germanium-antimony-tellurium (GeSbTe) or any metallic material with a resistivity higher than about 500 microohm centimeters ($\mu\neq$·cm). The resistive strap 110 utilizes a large boundary resistance for heat conduction across interfaces, but still provides relatively efficient electrical conduction across interfaces to achieve an efficient heat barrier between the MTJ portion 102 and the first electrically conductive layer 108. In this manner, thermal leakage is inhibited from reaching the first electrically conductive layer 108 and escaping therethrough, while still allowing current to flow through the MTJ portion 102. Although an embodiment described going forward includes the resistive strap 110, it is appreciated that the resistive strap 110 may be omitted in other embodiments.

According to a non-limiting embodiment, the resistive strap 110 may comprise multiple layers (not shown) of metal. In one case, each of the individual metal layers comprises a different metal or metal alloy. The metal layer may comprise a metal (with standard impurities as understood by one skilled in the art), metal alloys, and combinations of both. The metals include, but are not limited to, tantalum (Ta), tantalum nitride (TaN), nickel-chromium (NiCr), and nickel-chromium nitride (NiCrN). The various materials listed are useful because their resistance is high enough to limit the non-interfacial contribution to thermal conductivity without being so high as to add significant series electrical resistance to the device.

The MTJ portion 102 includes a ferromagnetic storage layer 112, a tunnel barrier layer 114 formed on an upper surface of the ferromagnetic storage layer 112, and a ferromagnetic sense layer 116 formed on an upper surface of the tunnel barrier layer 114. The ferromagnetic storage layer 112 and the ferromagnetic sense layer 116 each comprise various ferromagnetic materials including, but not limited to, cobalt (Co), iron (Fe,) and/or nickel (Ni), along with any alloy of these materials. The ferromagnetic storage layer 112 and the ferromagnetic sense layer 116 may also have a thickness ranging, for example, from approximately 1 nanometer (nm) to approximately 100 nm. The tunnel barrier layer 114 comprises, for example, magnesium oxide (MgO), and has a thickness ranging from, for example, approximately 0.5 nm to approximately 2 nm. The tunnel barrier layer 114 provides a tunnel magnetoresistance (TMR) effect as a result of being interposed between the ferromagnetic layers 112/116 as understood by one of ordinary skill in the art. The stray magnetic fields from the ferromagnetic material of the magnetic layers 112/116 cause the ferromagnetic storage layer 112 and the ferromagnetic sense layer 116 to have opposite magnetic orientations (shown by opposite pointing arrows).

The upper substrate portion 106 includes a second electrically conductive layer 118 and a second resistive contact layer 120 (i.e., a second resistive strap 120). The second electrically conductive layer 118 comprises any suitable electrically conductive material including, but not limited to, metal. The second resistive strap 120 is formed on an upper surface of the ferromagnetic sense layer 116. Accordingly, the second resistive strap 120 is interposed between the ferromagnetic sense layer 116 and the second electrically conductive layer 118. The second resistive strap 120 comprises a thermally resistive material configured such as, for example, tantalum nitride (TaN), tantalum-silicon nitride (TaSiN), cobalt-silicon nitride (CoSiN), germanium-antimony-tellurium (GeSbTe) or any metallic material with a resistivity higher than about 500 $\mu\Omega$·cm. Although an embodiment described going forward includes the second resistive strap 120, it is appreciated that the second resistive strap 120 may be omitted in other embodiments.

Similar to the first resistive strap 110, the second resistive strap 120 utilizes a large boundary resistance for heat conduction across interfaces, but still provides relatively efficient electrical conduction across interfaces to achieve an efficient heat barrier between the MTJ portion 102 and the second electrically conductive layer 118. In this manner, thermal leakage is inhibited from reaching the second electrically conductive layer 118 and escaping therethrough, while still allowing current to flow through the MTJ portion 102.

Figure 2:
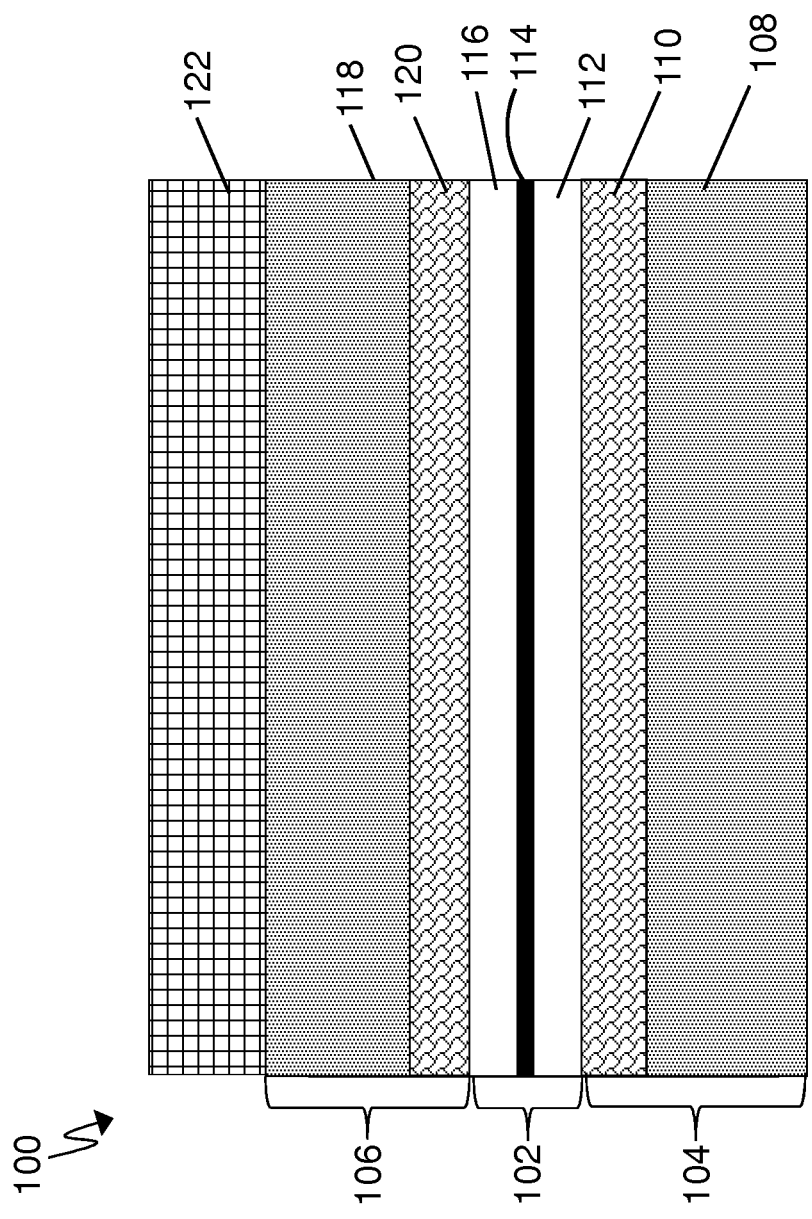

Turning now to FIG. 2, a block mask layer 122 is deposited on an upper surface of the second electrically conductive layer 118. The mask layer 122 may include various materials including, but not limited to, silicon nitride (SiN). The mask layer 122 can be deposited according to various processes including, but not limited to, a chemical vaporization deposition (CVD) process.

Figure 3:
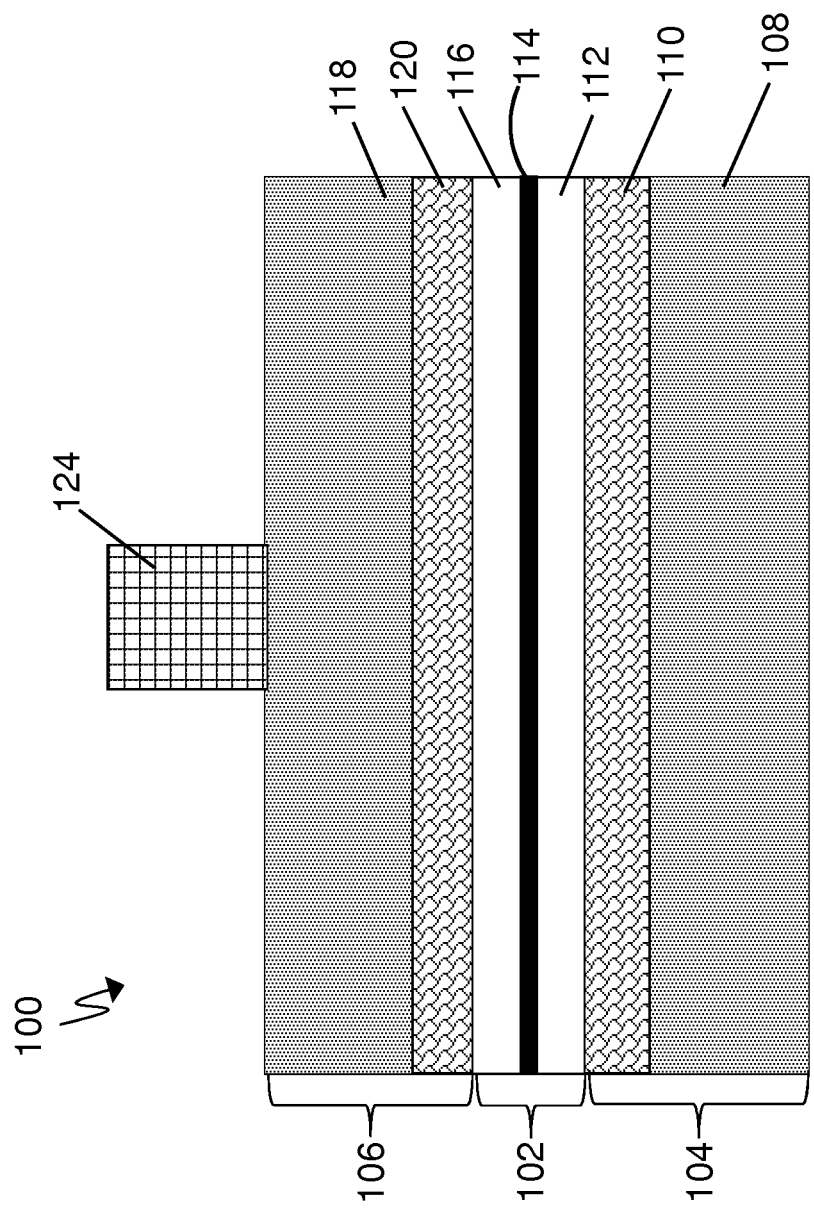
Figure 4:
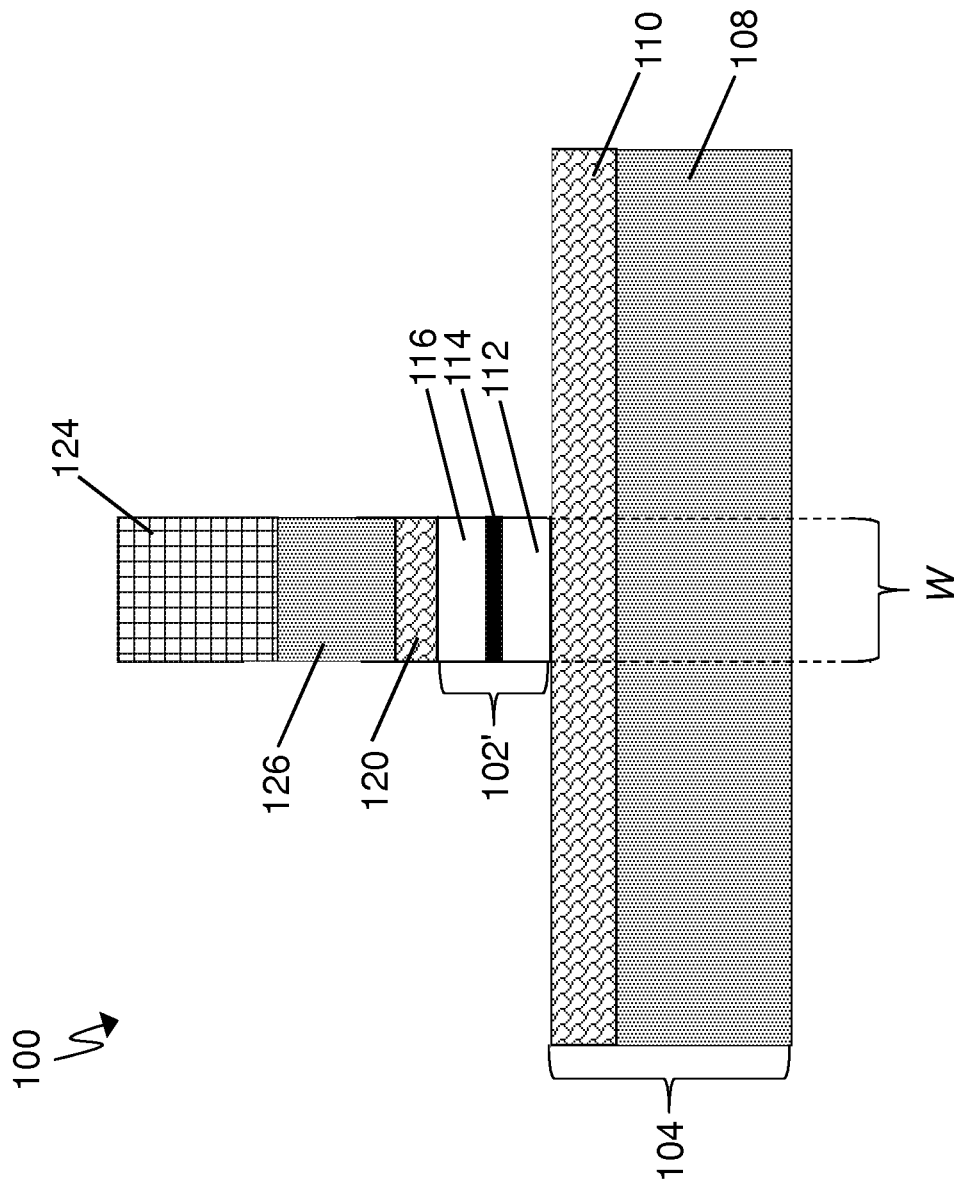

Referring to FIG. 3, the mask layer 122 is patterned to expose the underlying second electrically conductive layer 118 while forming a masking element 124 on the upper surface of the second electrically conductive layer 118. Various processes can be used to pattern the mask layer 122 including, but not limited to, a reactive ion etch (RIE) process. After forming the masking element 124, one or more etching processes are performed to etch through the upper substrate portion 106, and also extend the depth of the etch through the MTJ portion 102 to expose the first resistive strap 110 of the lower substrate portion 104 as illustrated in FIG. 4.

Figure 5:
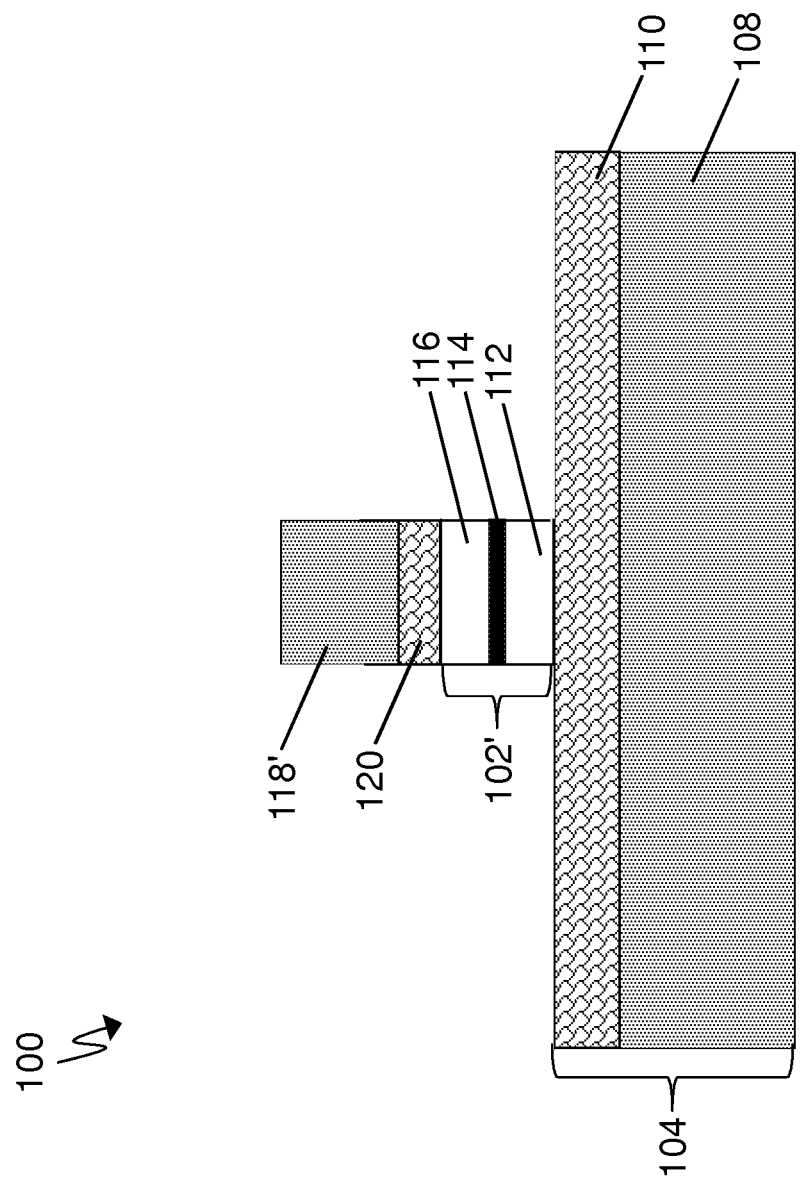

Turning to FIG. 5, the masking element 124 is removed to define an electrically conductive contact 118' on the upper surface of the remaining second resistive strap 120, and a MTJ 102' between the remaining second resistive strap 120 and the first resistive strap 110. The MTJ 102' operates according to a well-known TMR effect that performs a data write processing in response to heating the MTJ 102' to a write temperature (Twrite). The MTJ 102' can have a width (W) ranging from approximately 1 micrometer ($\mu$m) to approximately 5 nm. Conventional TAS-MRAM devices are susceptible to thermal leakage through the MTJ when performing the data write process. A TAS-MRAM device according to at least one non-limiting embodiment, however, improves thermal retention within the MTJ 102' as discussed in greater detail below.

Figure 6:
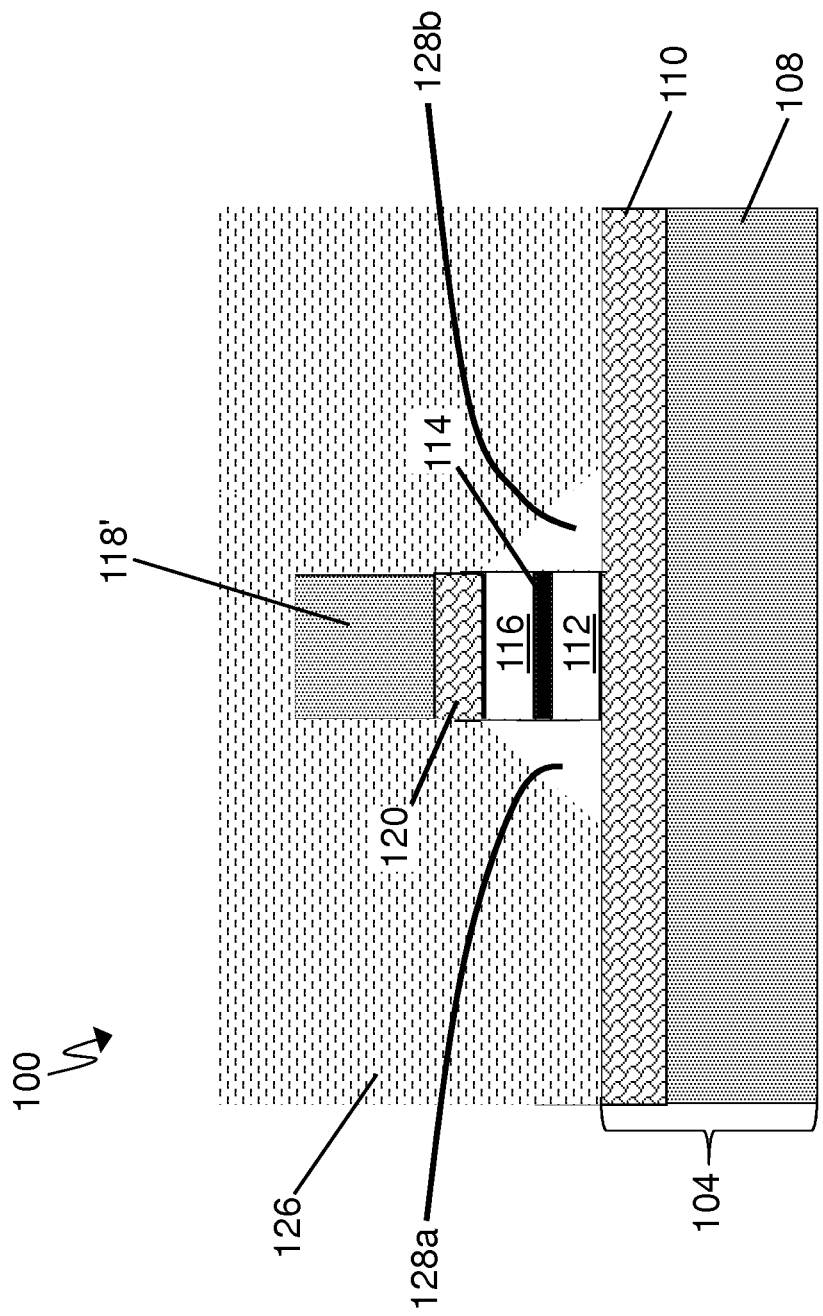

Referring now to FIG. 6, a block dielectric layer 126 is deposited on the exposed surface of the first resistive strap 110 to encapsulate the contact 118' and the MTJ 102'. Although the dielectric layer 126 is illustrated as being disposed directly on the first resistive strap 110, it should be appreciated that at least one embodiment can omit the resistive strap 110 such that the dielectric layer 126 is formed directly on the first electrically conductive layer 108. Further, although a non-limiting embodiment deposits the block dielectric layer 126 on the upper surface of the first resistive strap 110, other embodiments (not shown) include embedding the entire structure 100 within the dielectric material 126.

The dielectric layer 126 comprises various dielectric materials including, but not limited to, silicon nitride (SiN), silicon dioxide ($SiO_2$), and tetraethyl orthosilicate ($Si(OC_2H_5)_4$) and is deposited according to various deposition process including, but not limited to, chemical vapor deposition (CVD), physical vapor deposition (PVD), evaporation, and plasma enhanced chemical vapor deposition (PE-CVD). According to a non-limiting embodiment, the parameters of the deposition process are adjusted such that the dielectric layer 126 is non-conformally deposited and vacuum cavities 128a-128b are simultaneously formed at sidewalls of the MTJ 102' without requiring any additional masks and/or masking techniques. The parameters that can be adjusted include, but are not limited to, pressure, and a power ratio of a high power radio frequency (RF) with respect to a low power RF. According to a non-limiting embodiment, the vacuum cavities 128a-128b have a triangular shape defined by a length extending between a respective sidewall of the MTJ 102' and the dielectric layer 126, and a height extending between an upper surface of the MTJ 102' and the dielectric layer 126.

The dielectric layer 126 provides a thermal conductivity ranging from approximately 0.1 watts per meter-kelvins (W/(m·K) to approximately 3 W/(m·K) The vacuum cavities 128a-128b, however, are formed as a vacuum void and provide an extremely low thermal conductivity ranging from approximately 0.001 W/(m·K) to approximately 0.01 W/(m·K). According to a non-limiting embodiment, each of the first and second vacuum cavities are a free space having a pressure ranging from about $10^{-3}$ torr (Torr) to about $10^{-12}$ Torr. In this manner, the vacuum cavities 128a-128b increase thermal retention within the MTJ 102' compared to the thermal retention that occurs when depositing the dielectric layer 126 directly against the MTJ 102'.

Figure 7:
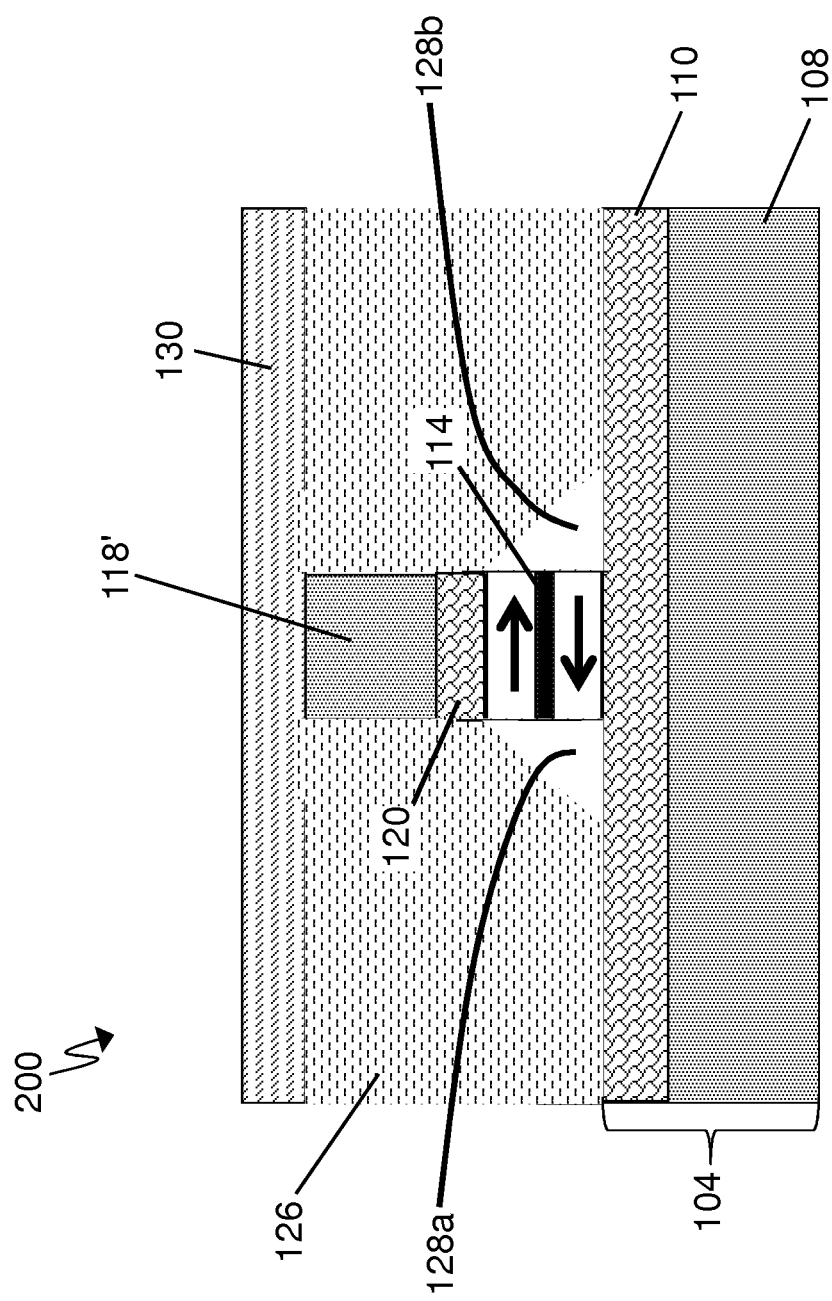

Turning now to FIG. 7, the upper surface of the dielectric layer 126 is recessed to expose the contact 118'. According to a non-limiting embodiment, a RIE process selective to metal may be applied to the dielectric layer 126. In this manner, the RIE process etches the dielectric layer 126, while stopping on an upper surface of the contact 118'. After exposing the contact 118', an electrically conductive electrode 130 is deposited on the upper surface of the dielectric layer 126 and on the upper surface of the contact 118' to form a TAS-MRAM device 200. The electrically conductive electrode 130 may be formed from various electrically conductive materials including, for example, metal. The TAS-MRAM device 200 has vacuum cavities 128a-128b surrounding the MTJ 102'. The vacuum cavities 128a-128b reduce thermal leakage from the MTJ 102' as described above. In turn, less power is required to achieve $T_{write}$ for the TAS-MRAM device 200. In this manner, at least one embodiment of the invention provides a TAS-MRAM device 200 having increased power efficiency compared to conventional TAS-MRAM devices.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A thermally assisted magnetoresistive random access memory (TAS-MRAM) device, comprising:
   a magnetic tunnel junction interposed between a first electrical contact and a second electrical contact; and
   a dielectric layer on an upper surface of the first electrical contact and encapsulating the second electrical contact, the dielectric layer having at least one vacuum cavity between an adjacent outer wall of the magnetic tunnel junction and the dielectric layer; and
   at least one resistive strap interposed between the magnetic tunnel junction and at least one of the first electrical contact and the second electrical contact.

2. The TAS-MRAM device of claim 1, wherein the at least one vacuum cavity includes a first and second vacuum cavities surrounding the magnetic tunnel junction.

3. The TAS-MRAM device of claim 2, wherein a first vacuum cavity is between a first outer wall of the magnetic tunnel junction and the dielectric layer and a second vacuum cavity is between a second outer wall of the magnetic tunnel junction and the dielectric layer.

4. The TAS-MRAM device of claim 3, wherein the first and second vacuum cavities have a length extending between a respective outer wall and the dielectric layer, and a height extending between the first electrical contact and an upper surface of the magnetic tunnel junction.

5. The TAS-MRAM device of claim 4, wherein each of the first and second vacuum cavities are a free space having a pressure ranging from about $10^{-3}$ torr (Torr) to about $10^{-12}$ Torr.

6. The TAS-MRAM device of claim 5, wherein the magnetic tunnel junction includes a tunnel barrier layer interposed between an opposing pair of ferromagnetic layers.

7. The TAS-MRAM device of claim 6, wherein the magnetic tunnel junction comprises magnesium oxide (MgO).

8. The TAS-MRAM device of claim 7, wherein the ferromagnetic layers comprise a ferromagnetic material selected from the group comprising cobalt (Co), iron (Fe) and nickel (Ni), and wherein a first ferromagnetic layer among the pair of ferromagnetic layers is a ferromagnetic storage layer, and a second ferromagnetic layer among the pair of ferromagnetic layers is a ferromagnetic sense layer.

9. The TAS-MRAM device of claim 1, wherein the at least one resistive strap comprises a thermally resistive material having a resistivity greater or equal to about 500 microohm centimeters ($\mu\Omega\cdot cm$).

10. A method of fabricating a thermally assisted magnetoresistive random access memory (TAS-MRAM) device, the method comprising:
    forming a magnetic tunnel junction between a first electrical contact and a second electrical contact; and
    performing a deposition process to deposit a dielectric layer on an upper surface of the first electrical contact and encapsulate the second electrical contact,
    wherein at least one vacuum cavity is formed between an adjacent outer wall of the magnetic tunnel junction and the dielectric layer while simultaneously depositing the dielectric layer, and
    wherein at least one resistive strap is interposed between the magnetic tunnel junction and at least one of the first electrical contact and the second electrical contact.

11. The method of claim 10, wherein the at least one vacuum cavity is formed in response to adjusting parameters of the deposition process such that the dielectric layer is non-conformally deposited and the at least one vacuum cavity is simultaneously formed between at least one sidewall of the magnetic tunnel junction and the dielectric layer.

12. The method of claim 11, wherein the parameters include at least one of a pressure, and a power ratio of a high power radio frequency (RF) with respect to a low power RF.

13. The method of claim 12, wherein the at least one vacuum cavity includes first and second vacuum cavities surrounding the magnetic tunnel junction.

14. The method of claim 13, wherein the first and second vacuum cavities have a length extending between a respective outer wall and the dielectric layer, and a height extending between the first electrical contact and an upper surface of the magnetic tunnel junction.

15. The method of claim 14, wherein each of the first and second vacuum cavities are a free space having a pressure ranging from about $10^{-3}$ torr (Torr) to about $10^{-12}$ Torr.

16. The method of claim 15, wherein forming the magnetic tunnel junction includes forming a tunnel barrier layer between an opposing pair of ferromagnetic layers.

17. The method of claim 16, wherein the magnetic tunnel junction comprises magnesium oxide (MgO).

18. The method of claim 17, wherein the ferromagnetic layers comprise a ferromagnetic material selected from the group comprising cobalt (Co), iron (Fe) and nickel (Ni), and wherein a first ferromagnetic layer among the pair of ferromagnetic layers is a ferromagnetic storage layer, and a second ferromagnetic layer among the pair of ferromagnetic layers is a ferromagnetic sense layer.

19. The method of claim 18, wherein the at least one resistive strap comprises a thermally resistive material having a resistivity greater or equal to about 500 microohm centimeters ($\Omega\mu\cdot cm$).

* * * * *